(12) United States Patent
Aigner et al.

(10) Patent No.: US 7,455,786 B2
(45) Date of Patent: Nov. 25, 2008

(54) PIEZOELECTRIC OSCILLATING CIRCUIT, METHOD FOR MANUFACTURING THE SAME AND FILTER ARRANGEMENT

(75) Inventors: Robert Aigner, Unterhaching (DE); Lueder Elbrecht, Munich (DE); Martin Handtmann, Munich (DE); Stephan Marksteiner, Putzbrunn (DE); Winfried Nessler, Munich (DE); Hans-Joerg Timme, Ottobrunn (DE)

(73) Assignee: Avago Technologies Wireless IP, Singapore (SG)

( * ) Notice: Subject to any disclaimer, the term of this patent is extended or adjusted under 35 U.S.C. 154(b) by 314 days.

(21) Appl. No.: 10/869,817

(22) Filed: Jun. 16, 2004

(65) Prior Publication Data

US 2005/0062363 A1  Mar. 24, 2005

Related U.S. Application Data

(63) Continuation of application No. PCT/EP02/13137, filed on Nov. 22, 2002.

(30) Foreign Application Priority Data

Dec. 19, 2001  (DE) ............................... 101 62 580

(51) Int. Cl.
*H02N 2/00* (2006.01)
*H01B 13/00* (2006.01)
(52) U.S. Cl. ..................................... 216/13
(58) Field of Classification Search ........... None
See application file for complete search history.

(56) References Cited

U.S. PATENT DOCUMENTS

| | | | |
|---|---|---|---|
| 5,035,202 A | 7/1991 | Nishikawa et al. | |
| 5,118,982 A * | 6/1992 | Inoue et al. | 310/366 |
| 5,873,153 A | 2/1999 | Ruby et al. | |
| 6,051,907 A | 4/2000 | Ylilammi | |
| 6,249,074 B1 | 6/2001 | Zimnicki et al. | |
| 6,339,276 B1 * | 1/2002 | Barber et al. | 310/312 |
| 6,414,569 B1 * | 7/2002 | Nakafuku | 333/188 |
| 6,617,249 B2 * | 9/2003 | Ruby et al. | 438/689 |
| 6,625,855 B1 * | 9/2003 | Takata et al. | 29/25.35 |
| 6,864,619 B2 * | 3/2005 | Aigner et al. | 310/321 |
| 6,975,184 B2 * | 12/2005 | Wang et al. | 333/188 |
| 2001/0028285 A1 * | 10/2001 | Klee et al. | 333/188 |
| 2002/0030424 A1 * | 3/2002 | Iwata | 310/363 |
| 2002/0062542 A1 * | 5/2002 | Takata et al. | 29/25.35 |
| 2002/0121944 A1 * | 9/2002 | Larson et al. | 333/187 |
| 2002/0166218 A1 * | 11/2002 | Barber | 29/25.35 |
| 2003/0020365 A1 * | 1/2003 | Yamada et al. | 310/311 |
| 2004/0070313 A1 * | 4/2004 | Furukawa et al. | 310/313 R |
| 2004/0130847 A1 * | 7/2004 | Aigner et al. | 361/160 |
| 2005/0224450 A1 * | 10/2005 | Barber et al. | 216/37 |

FOREIGN PATENT DOCUMENTS

| | | |
|---|---|---|
| JP | 55115710 | 9/1980 |
| JP | 05267970 | 3/1992 |
| JP | 2001177372 A | 6/2001 |
| WO | WO 99/10938 | 3/1999 |

* cited by examiner

*Primary Examiner*—Allan Olsen

(57) ABSTRACT

In a method for manufacturing a piezoelectric oscillating circuit in thin film technology, wherein the oscillating circuit includes a predetermined natural frequency and a plurality of layers, first of all at least a first layer of the piezoelectric oscillating circuit is generated. Subsequently, by processing the first layer a frequency correction is performed. Subsequently, at least a second layer of the piezoelectric oscillating circuit is generated and processed for performing a second frequency correction.

10 Claims, 2 Drawing Sheets ately larger than the diameter of an individual piezoelectric oscillating circuit (device) which is approx. 1 mm, but is substantially smaller than the diameter of the wafer (substrate), which is at approx. 50-200 mm. A locally different removal on the wafer according to the required frequency correction is achieved by scanning the beam across the substrate with a locally different etching rate and/or speed.
PIEZOELECTRIC OSCILLATING CIRCUIT, METHOD FOR MANUFACTURING THE SAME AND FILTER ARRANGEMENT

CROSS-REFERENCE TO RELATED APPLICATIONS

This application is a continuation of co-pending International Application No. PCT/EP02/13137, filed Nov. 22, 2002, which designated the United States and was not published in English, which is based on German Application No. 101 62 580.4, filed Dec. 19, 2001.

BACKGROUND OF THE INVENTION

1. Field of the Invention

The present invention relates to piezoelectric oscillating circuits and here in particular to a method for manufacturing a piezoelectric oscillating circuit in thin-film technology for adjusting a predetermined natural frequency of the oscillating circuit. Further, the present invention relates to filter arrangements including thus manufactured piezoelectric oscillating circuits.

2. Description of the Related Art

Piezoelectric oscillating circuits generally include a piezoelectric layer, which is at least partially arranged between opposing electrodes. The electrodes may be multilayer structures or single layer structures. The individual layers of a piezoelectric oscillating circuit are manufactured in thin film technology. The natural frequency in such piezoelectric oscillating circuits, which are manufactured in thin film technology, strongly depends on the layer thickness of the individual layers (electrode layers, piezoelectric layers etc.). The separation accuracy of methods used in thin layer technology, for example PVD, CVD, vapor deposition etc., is typically at (max−min)/mean value=10%. The layer thicknesses hereby vary within the substrate (wafer) and from substrate to substrate. By optimizing the deposition processes, this thickness variation may be improved to 2 to 3%.

For use in the LF area, this accuracy may be sufficient, however, piezoelectric oscillating circuits are preferably used in filters of RF applications up to the GHz area. An exemplary filter configuration is a band pass filter which is among others used in mobile communication devices. For such applications, the required accuracy in thin film technology lies below 0.1 percent (max−min) for the location of the natural frequency.

In order to achieve the accuracy of the frequency position required for the RF area, a method for manufacturing a layer having a default layer thickness profile is known. Here, on a substrate after the deposition of the piezoelectric oscillating circuits, the natural frequency is determined at several positions of the substrate/wafer by measurement and from the deviation of the measured frequency from the specified target frequency a required thinning of a top layer of the individual piezoelectric oscillating circuits is determined. This thinning is in this method achieved by a local sputtering off of the top layer using an ion beam. The ion beam has a diameter of about 10 mm, which is substantially larger than the diameter of an individual piezoelectric oscillating circuit (device) which is approx. 1 mm, but is substantially smaller than the diameter of the wafer (substrate), which is at approx. 50-200 mm. A locally different removal on the wafer according to the required frequency correction is achieved by scanning the beam across the substrate with a locally different etching rate and/or speed.

This known method is only applied to a topmost layer of the generated and completed thin layer oscillating circuit, and due to the fact that this method is only applied once to this topmost layer after an overall completion of the piezoelectric oscillating circuit, the following requirements result for the topmost layer and for the reproducibility and accuracy of the etching step.

The depositions of all layers contained within the piezoelectric oscillating circuit result in a scattering of the normal frequency of all produced oscillating circuits of (max−min)/mean value=10%. In order to be able to correct this scattering completely, the mean value needs to be arranged by a corresponding lead in the deposition, so that the natural frequency of all generated piezoelectric oscillating circuits (devices) is below the specified target frequency, as due to the etching off of the topmost layer only a correction of the natural frequency in an upward direction may be performed.

Further, the topmost layer needs to be sufficiently thick, so that a shifting of the natural frequency by 10% is possible by thinning without completely removing this layer. This causes that the piezoelectric oscillating circuits only comprise a minimum scattering in frequency distribution after that correction, the thickness of the topmost layer, however, substantially scatters, as all thickness errors of the overall layer staple need to be corrected by the topmost layer. This causes a strong scattering of other characteristic features of the piezoelectric oscillating circuits, like e.g. the piezoelectric coupling, the excitement of undesired lateral modes or electric losses.

A further requirement resulting from the above known method relates to the accuracy of the etching process. In order to hit a frequency distribution with a width of 10% in a target window of 0.1%, the etching process needs to comprise a relative accuracy and repeatability of better than 1%. This requirement not only results for the etching rate of the process, i.e. the removal of the topmost layer in nanometers, but also for the association which frequency shift is caused by a predetermined thickness removal. Only when both values, the etching rate in nm/sec and the frequency change rate in MHz/nm, are known to be an accuracy greater than 1% and are stable, may the above described local etching step bring all piezoelectric oscillating circuits into the specified frequency window in one process step.

The problem in the above described method is, however, that it is relatively difficult to determine the two relevant parameters, the etching rate and the frequency change rate with an accuracy of below 1% for every wafer.

SUMMARY OF THE INVENTION

It is the object of the present invention to provide an improved method for manufacturing a piezoelectric oscillating circuit enabling an accurate adjustment of the natural frequency of the piezoelectric oscillating circuit with a simultaneous reduction of the requirements for the accuracy of the correcting method.

The present invention provides a method for manufacturing a piezoelectric oscillating circuit in thin film technology, wherein the piezoelectric oscillating circuit has a predetermined natural frequency (eigenfrequency), and wherein the piezoelectric oscillating circuit includes a piezoelectric layer having two opposing surfaces, a bottom electrode on one of the opposing surfaces and a top electrode on the other of the opposing surfaces, the method including:

(a) generating at least one first top electrode layer of the top electrode;

(b) performing a first frequency correction by reducing or increasing the thickness of the first top electrode layer generated in step (a);

(c) generating at least one second top electrode layer on the first top electrode layer; and (d) performing a second frequency correction by reducing or increasing the thickness of the second top electrode layer generated in step (c).

According to a further aspect of the present invention, a piezoelectric oscillating circuit is provided, manufactured according to the inventive method.

According to another further aspect of the present invention, a filter arrangement is provided including one or several piezoelectric oscillating circuits manufactured according to the inventive method.

The present invention is based on the finding, that the above mentioned difficulty, to determine the two parameters relevant for frequency correction, i.e. the etching rate and the frequency change rate, with an accuracy of below 1% for each wafer, may be prevented by the fact that an extended multistage etching method is used, whereby the accuracy requirements for each of the etching steps may be clearly reduced. According to the invention, the frequency correction, in contrast to the above described methods, is performed in manufacturing piezoelectric oscillating circuits in thin layer technology, step-wise by several, if applicable, local etching steps in layers with different frequency change rates, whereby the accuracy requirements for each individual etching step may be clearly reduced.

According to a preferred embodiment of the present invention, in the manufacturing process of a piezoelectric oscillating circuit, after the deposition of a certain layer which need not be the top layer or the topmost layer of the completed piezoelectric oscillating circuit, the natural frequency of the hitherto created piezoelectric oscillating circuit is measured and compared to a target frequency for this possibly not completed piezoelectric oscillating circuit. In connection with this calculation also the additional frequency shift may be considered which results from the deposition of the remaining layers of the planned thickness. It is to be noted, that the target frequency of the half-completed piezoelectric oscillating circuit is generally higher than the target frequency of the completed piezoelectric oscillating circuit, as the additional layers always change the natural frequency downwards.

By comparing the measured natural frequency to the calculated target frequency, either for the completed piezoelectric oscillating circuit or for the partially completed piezoelectric oscillating circuit, a correction may then be defined. This correction is performed according to a preferred embodiment by a local sputtering off of the top layer of the possibly half-completed piezoelectric oscillating circuit using an ion beam, i.e. by a local etching method at the position in the manufacturing process at which also the natural frequency of the piezoelectric oscillating circuit, which was formed up to here in the process, would be measured. After this first correction, the remaining layers are deposited on the existing piezoelectric oscillating circuit or the half completed piezoelectric oscillating circuit, respectively. Subsequently, the natural frequency is determined again and the local etching method is repeated in the topmost layer of the now completed piezoelectric oscillating circuit.

It is the advantage of this inventive multistage method that by a first coarse frequency correction already a large part of the frequency variations by layer thickness errors is corrected and thus the overall amount which has to be etched away in the last correction etching in the topmost layer of the completed piezoelectric oscillating circuit is clearly less. On the one hand, hereby the thickness distribution of the topmost layer in manufacturing a plurality of piezoelectric oscillating circuits on a wafer may be kept substantially narrower, so that the oscillating circuits are substantially more homogeneous in their characteristics. On the other hand, a relative error in the etching rate or the frequency change rate is not as severe anymore as in the above described single step method according to the prior art.

It is the advantage of the present invention that, in contrast to the above described method of the prior art teaching a local etching by frequency correction of piezoelectric oscillating circuits in thin film technology, the present invention provides an improved method in which a two or multi-stage method is used for frequency correction, wherein according to the invention first of all a coarse correction is performed in a layer with a great frequency change rate, and subsequently a fine correction is performed with a lower frequency change rate in another layer deposited after the first correction. This leads to a strong reduction of the scattering of the thicknesses of those layers used for the correction, and the requirements concerning the accuracy of the correction method may be reduced according to one embodiment by almost a factor of 10.

BRIEF DESCRIPTION OF THE DRAWINGS

These and other objects and features of the present invention will become clear from the following description taken in conjunction with the accompanying drawings, in which:

FIGS. 1 to 3 show an example of the different structures which result after different manufacturing steps of a process run for manufacturing piezoelectric oscillating circuits in thin film technology according to the present invention.

DESCRIPTION OF THE PREFERRED EMBODIMENTS

Figure 1:
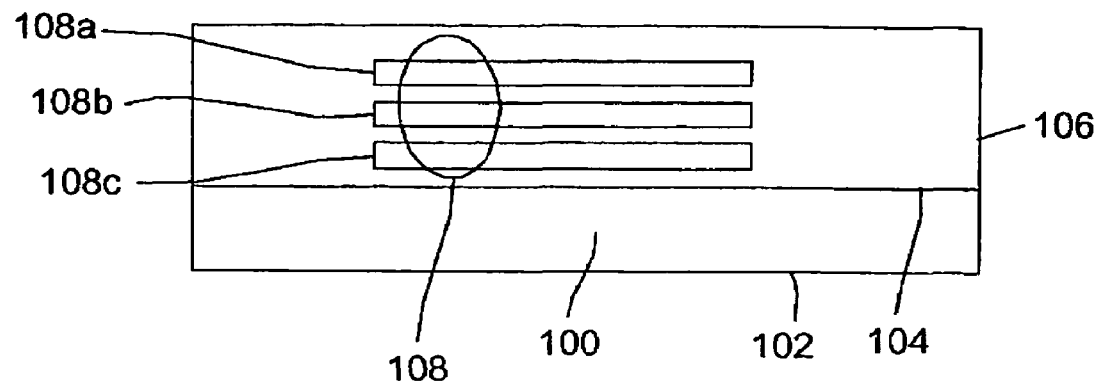
FIGS. 1 to 3 show an embodiment for the inventive manufacturing method of a piezoelectric oscillating circuit with a predetermined natural frequency.

In FIG. 1 a structure is illustrated as it results after a first manufacturing section. In this manufacturing section, first of all a carrier substrate 100 is provided, which for example includes a silicon wafer, a glass carrier or another suitable substrate. The carrier substrate 100 includes a first bottom surface 102 and a second top surface 104 opposing the bottom surface 102. On the top surface 104 of the substrate 100 an acoustic insulation layer 106 is applied in which an acoustic insulator 108 is arranged which prevents an acoustic oscillation of a subsequently deposited piezoelectric oscillating circuit to leak into the substrate 100. In the embodiment described in FIG. 1, the acoustic insulator 108 is formed by an acoustic reflector comprising a plurality of layers 108a to 108c with alternating high or low acoustic impedance. Alternatively, instead of the acoustic reflector 108 also a cavity may be formed within the acoustic insulation layer 106 which has the same effect as the acoustic reflector. Instead of the acoustic insulation layer 106 also the substrate 100 may be provided with a membrane area on which subsequently the piezoelectric oscillating circuit is formed so that the cavity defined below the membrane area within the substrate provides for the required acoustic decoupling of oscillating circuit and substrate.

Figure 2:
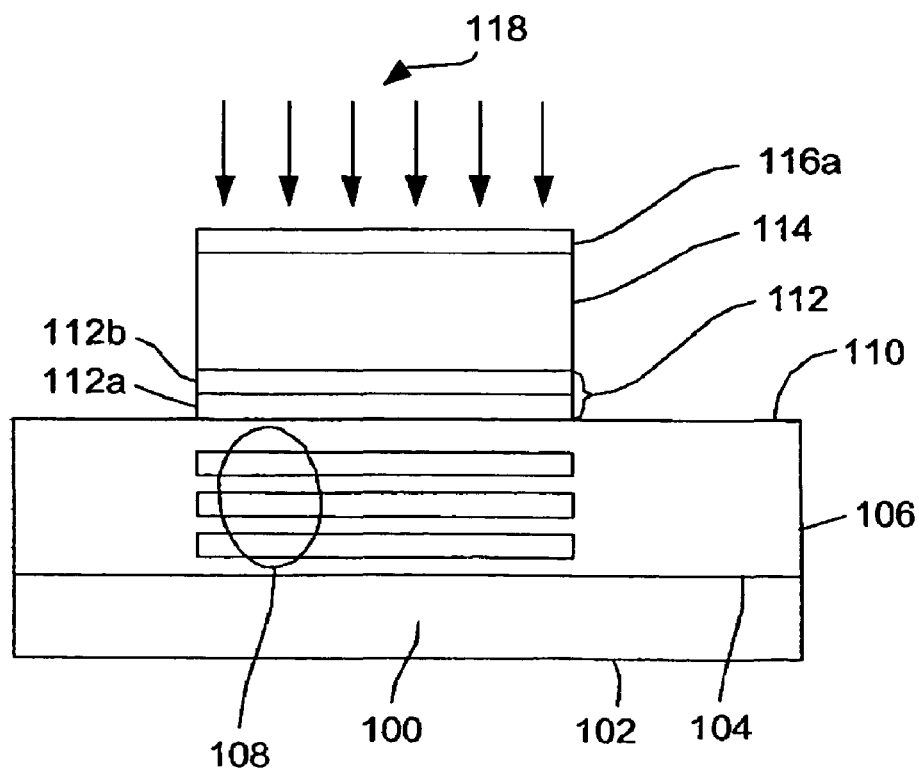

In a subsequent manufacturing step, whose final structure is shown in FIG. 2, on a top surface 110 of the acoustic insulation layer 106 a bottom electrode 112 is at least partially deposited. The bottom electrode 112 may be a single layer electrode or it may, as in the embodiment illustrated in FIG. 2, be a multilayer electrode, here including a first bottom electrode layer 112a and a second bottom electrode layer 112b. At least one of the bottom electrode layers 112a, 112b is electrically conductive. Further, the bottom electrode 112 may include further layers (not illustrated in FIG. 2), required for improving the acoustic characteristics and/or due to the process, as for example a timing layer, a so called seed layer, etc.

As it may be seen in FIG. 2, the first bottom electrode layer 112a is at least partially deposited onto a section of the top surface 110 of the acoustic insulation layer 106, and on the surface of the first bottom electrode layer 112a facing away from the substrate 100 the second bottom electrode layer 112b is formed.

On the surface of the second bottom electrode layer 112b facing away from the substrate 100 a piezoelectric layer 114 is deposited, on which again in subsequent processes a top electrode is deposited, which may consist of a single layer or of several single layers, wherein also here at least one of these layer is electrically conductive. According to the described embodiment, however, as it is shown in FIG. 2, first of all only a first, top electrode layer 116a is deposited. Now, the natural frequency of the partial oscillating circuit completed up to this process section is determined and compared to a desired target frequency. The piezoelectric layer 114 is manufactured from a suitable piezoelectric material, like for example aluminum nitride (AlN), zinc oxide (ZnO) or lead zirconium titanate (PZT).

The measurement of the natural frequency of the partially completed piezoelectric oscillating circuit, as it is for example shown in FIG. 2, may now be performed in different ways.

A first possibility is, that the partially completed piezoelectric oscillating circuit, as also shown in FIG. 2, includes an electrically conductive top electrode already before the first correction, which is the first top electrode layer 116a in FIG. 2. When the piezoelectric oscillating circuit has been manufactured so far, this electrically conductive layer 116a may be structured after depositing the same so that the piezoelectric oscillating circuit or several oscillating circuits manufactured on a wafer may be electrically contacted and therefore measured. From the resulting impedance curve the natural frequency may then be determined depending on the frequency.

A second possibility is to excite the partially completed piezoelectric oscillating circuit in a different way to the electric way, e.g. by a pulsed laser. This is required when no electrically conductive layer is provided for a corresponding electrical excitement of the oscillating circuit. In this case, by observing the propagation of the acoustic oscillating circuit induced by the pulsed layer, the natural frequency of the oscillating circuit may be determined, for example from the temporal delay of the echo of the excitement of lower layers.

Further, a frequency correction may even be performed when the natural resonance of the partially completed piezoelectric oscillating circuit may not be determined by measurement. In this case, the natural frequency is determined by accurately measuring the layer thicknesses of all layers of the piezoelectric oscillating circuit which have been deposited up to then, which, however, requires a very high measuring accuracy of all those layers and an accurate determination and repeatability of the acoustic parameters of all layers which were used hitherto. Due to the thus gained information about the layers, the natural resonance may then be calculated and from this a correction may be derived.

After having determined the natural frequency of the piezoelectric oscillating circuit in the above described way, comprising the partially completed structure shown in FIG. 2, and after comparing the same to a desired target frequency, the required correction may be derived from this. Hereby it is determined to which value the thickness of the top layer 116a is to be adjusted. Using a local etching process indicated by arrows 118a in FIG. 2, the thickness of the first top electrode layer 116a is set to a determined value.

Figure 3:
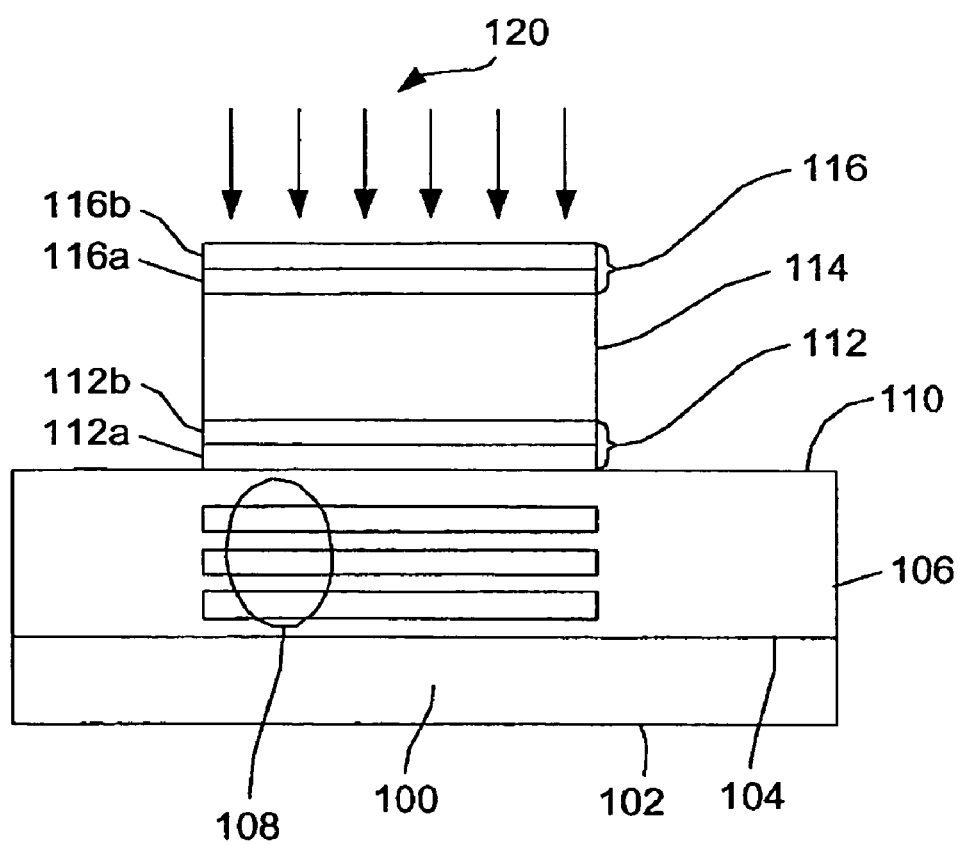

After the layer thickness of the first top electrode layer 116a was set to the desired value, the deposition of the last layer in the described embodiment for the completion of the piezoelectric oscillating circuit is performed. As it is shown in FIG. 3, onto the first top electrode layer 116a a second top electrode layer 116b is deposited, so that by the two top electrode layers the top electrode 116 is formed. Subsequently, again a determination of the natural frequency of the now almost completed piezoelectric oscillating circuit is performed in one of the above described ways, and depending on the determined natural frequency a required thinning of the second top electrode layer 116b is determined which is then set using a local etching process indicated by the arrows 120.

It is the advantage of the above described method for producing a piezoelectric oscillating circuit, that in particular when producing a plurality of piezoelectric oscillating circuits on a wafer the layer thickness distribution of the topmost layer of the top electrode 116 is almost 10 times more accurate than with a single stage method.

It is a further advantage of the present invention, that the requirements regarding the accuracy of the local etching processes are reduced by the factor of 10, as it is briefly explained in the following. With a frequency deviation of 10% before the first local etching step 118 and a relative accuracy of the local etching method 118 of 10%, the calculated target frequency within this first frequency correction may be achieved with an accuracy of about 1%. The further layers required for the completion of the piezoelectric oscillating circuit may then be selected so that their influence on frequency scattering remains less than 1% even with a layer thickness variation of these layers of 10%. Thereby it is achieved to select materials with a low frequency change rate and to deposit only thin layers of the same. This way, the already achieved accuracy of the frequency distribution of 1% by the deposition of the last layers is not substantially deteriorated in the embodiment of the last layer 116 described with reference to the Figures. After the deposition of the last layer, the frequency distribution is again corrected by local etching 120, wherein the maximum deviation from the target frequency is now only 1%. The necessary lead and the maximum thinning are also 10 times less than in case of a single stage method. The local etching process is again used with an accuracy of 10%, so that by this a target accuracy of the final frequency may be achieved which corresponds to the specified accuracy of 0.1%.

It is to be noted that the present invention is of course not limited to the two stage correction method described above with reference to the figures, but that also three or more correction steps may be used.

As an example, now a piezoelectric oscillating circuit with a desired natural frequency of about 2 GHz is considered. In this case, for the top electrode 116 a two-layer structure is suitable, as it was described above with reference to the figures, wherein the first top electrode layer 116a is manufactured from a denser acoustic material, like e.g. tungsten, and wherein the second top electrode layer 116b is manufactured from an acoustically less dense material, like e.g. aluminum. The first correction (see FIG. 2) is performed after the deposition of the tungsten layer 116a in which the frequency change rate is high, about 3 MHz/nm. In this layer a correction by up to 10% of the target frequency, which corresponds to a frequency correction by 200 MHz in the selected embodiment, is possible with a relatively low material removal (maximum 66 nm), from which additionally a short processing time results. The removal of the aluminum layer 116b (see FIG. 3) of the top electrode staple 116 causes only a small or no extension of the frequency distribution, despite the layer thickness error in aluminum deposition, as with this layer 116b the frequency change rate is small, approx. 0.5 MHz/nm. Very small frequency corrections, a maximum of 20 MHz, may here be achieved by a removal of a maximum of 40 nm of aluminum.

If a plurality of piezoelectric oscillating circuits are simultaneously produced on a wafer, then with a deposition of aluminum with a thickness of 300 nm as the topmost electrode layer 116b it may be achieved, that all corrected piezoelectric oscillating circuits on a wafer comprise an aluminum layer thickness of between 260 nm and 300 nm. For the frequency distribution after the second etching process 120, process deviations of about 10% result in a width of (max−min)/mean value=2 MHz, which corresponds to the required accuracy of 0.1%.

In the above described conventional single stage method, a frequency scattering of 200 MHz in the topmost aluminum layer would have to be corrected alone, which means that an aluminum layer with a thickness of about 600 nm would have to be deposited. The reason for this is that a layer thickness of 200 nm of aluminum is required at least in order to achieve a sufficient electrical conductivity, and further 400 nm are required as a lead in order to compensate for a scattering of 200 MHz. As on some systems no removal, on others, however, a correction of 200 MHz will be required, in these processes piezoelectric oscillating circuits with a layer thickness of the topmost layer of 600 nm and other piezoelectric oscillating circuits with a thickness of 200 nm will result. These extreme piezoelectric oscillating circuits will differ by about 10% in the effective piezoelectric coupling factors.

This problem is avoided by the inventive two-stage etching process.

Although above preferred examples for the inventive method for a frequency correction were described, in which always a part was removed (thinned) from the deposited layers, the present invention is not limited to that. Based on the above described principle, a two or multistage frequency correction may also be achieved by the fact that individual or all layers within the inventive processing of the layer for frequency correction experience an increase of thickness.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method for manufacturing a piezoelectric oscillating circuit in thin film technology, wherein the piezoelectric oscillating circuit comprises a predetermined natural frequency, and wherein the piezoelectric oscillating circuit includes a piezoelectric layer having two opposing surfaces, a bottom electrode on one of the opposing surfaces and a top electrode on the other of the opposing surfaces, the method comprising:

(a) depositing a first material which forms a first top electrode layer of the top electrode and which causes a first frequency change of the piezoelectric oscillating circuit depending on a thickness change of the first top electrode layer;

(b) etching the first material for performing a first frequency correction such that a thinned first top electrode layer remains;

(c) depositing a second material which forms a second top electrode layer on the thinned first top electrode layer and which causes a second frequency change of the piezoelectric oscillating circuit depending on a thickness change of the second top electrode layer, wherein the first frequency change is greater than the second frequency change; and (d) etching the second material for performing a second frequency correction such that a thinned second top electrode layer remains.

2. The method according to claim 1, wherein the first frequency correction in step (b) causes a coarse setting of the frequency, and wherein the second frequency correction in step (d) causes a fine setting of the frequency.

3. The method according to claim 1, including the following steps after step (a) and after step (b):

determining the natural frequency of the structure resulting after step (a) and after step (b), respectively; and depending on the determined natural frequency of the structure and depending on the desired natural frequency of the piezoelectric oscillating circuit, determining a required thickness change of the first top electrode layer and the second top electrode layer for the first frequency correction and for the second frequency correction.

4. The method according to claim 1, comprising the following steps:

(e) generating at least a third top electrode layer on the second top electrode layer; and (f) performing a third frequency correction by reducing or increasing the thickness of the third top electrode layer generated in step (e).

5. The method according to claim 1, wherein a plurality of piezoelectric oscillating circuits are generated on a wafer, wherein in step (a) on the wafer the at least one first top electrode layer for a number of the piezoelectric oscillating circuits is generated in a structured way, wherein in step (b) the first frequency correction is applied to the overall wafer, wherein in step (c) the at least one second top electrode layer is generated for all piezoelectric oscillating circuits in a structured way, and wherein in step (d) the second frequency correction is applied to the overall wafer.

6. The method according to claim 5, wherein the first frequency correction and the second frequency correction include the step-wise processing of different areas of the wafer.

7. The method according to claim 1, wherein step (a) includes the following steps:

(a.1.) providing a substrate;

(a.2.) generating the bottom electrode on at least one portion of the substrate;

(a.3.) generating the piezoelectric layer on at least one portion of the bottom electrode; and (a.4.) generating the first top electrode layer for the top electrode on at least one portion of the piezoelectric layer.

8. The method according to claim 7, wherein step (a.1.) includes generating an acoustic insulator on or in the substrate in order to prevent a leaking of the acoustic oscillation into the substrate.

9. The method according to claim 7, wherein the first top electrode layer is manufactured from an acoustically dense material, and wherein the second top electrode layer is manufactured from a material whose acoustic density is lower compared to the material of the first top electrode layer.

10. The method according to claim 9, wherein the top electrode or the bottom electrode are manufactured from aluminum or tungsten.

* * * * *